US008926753B2

(12) United States Patent
Yamada

(10) Patent No.: US 8,926,753 B2
(45) Date of Patent: Jan. 6, 2015

(54) VAPOR PHASE GROWTH APPARATUS AND METHOD OF FABRICATING EPITAXIAL WAFER

(75) Inventor: Toru Yamada, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 2015 days.

(21) Appl. No.: 10/582,802

(22) PCT Filed: Nov. 18, 2004

(86) PCT No.: PCT/JP2004/017193
§ 371 (c)(1),
(2), (4) Date: Jun. 14, 2006

(87) PCT Pub. No.: WO2005/059981
PCT Pub. Date: Jun. 30, 2005

(65) Prior Publication Data
US 2007/0107653 A1    May 17, 2007

(30) Foreign Application Priority Data
Dec. 17, 2003  (JP) ................ 2003-419201

(51) Int. Cl.
H01L 21/20 (2006.01)
C23C 16/455 (2006.01)
C30B 25/14 (2006.01)

(52) U.S. Cl.
CPC ............... *C23C 16/455* (2013.01); *C30B 25/14* (2013.01)
USPC ............. 118/715; 118/728; 118/730; 117/84; 117/200

(58) Field of Classification Search
USPC .............. 117/84, 86, 95, 97, 200–220; 427/248.1; 118/715, 726, 728, 730
See application file for complete search history.

(56) References Cited

U.S. PATENT DOCUMENTS

| 4,745,088 | A | * | 5/1988 | Inoue et al. | 117/98 |
| 5,246,500 | A | * | 9/1993 | Samata et al. | 118/719 |
| 5,558,721 | A | * | 9/1996 | Kohmura et al. | 118/730 |
| 5,916,369 | A | * | 6/1999 | Anderson et al. | 118/715 |
| 5,993,557 | A | * | 11/1999 | Tomita et al. | 118/730 |
| 6,001,175 | A | * | 12/1999 | Maruyama et al. | 117/102 |

(Continued)

FOREIGN PATENT DOCUMENTS

| EP | 0 637 058 A1 | 2/1995 |
| EP | 0 637 058 B1 | 2/1995 |

(Continued)

*Primary Examiner* — Matthew Song
(74) *Attorney, Agent, or Firm* — Oliff PLC

(57) ABSTRACT

Material gas hits the outer peripheral surface of a dam member and rides on the upper surface side, and then is allowed to flow along the main surface of a silicon single-crystal substrate placed on a susceptor. An upper lining member is disposed above the dam member so as to face the dam member. A gas introducing clearance is formed between the dam member and the upper lining member. In a vapor growth device, the upper lining member is regulated in size so that the length, formed in a direction along the horizontal reference line, of the gas introducing clearance gradually decreases as it is away from the horizontal reference line or is kept constant at any position. A vapor growth device capable of making more uniform the flowing route of a material gas flowing on the silicon single-crystal substrate, and a production method for an epitaxial wafer are provided.

6 Claims, 13 Drawing Sheets

(56) References Cited

U.S. PATENT DOCUMENTS

| | | | |
|---|---|---|---|
| 6,129,047 A * | 10/2000 | Nakamura | 118/725 |
| 6,153,260 A | 11/2000 | Comita et al. | |
| 6,254,686 B1 | 7/2001 | Comita et al. | |
| 2002/0179586 A1* | 12/2002 | Wengert et al. | 219/390 |
| 2005/0100669 A1* | 5/2005 | Kools et al. | 427/255.23 |
| 2007/0122323 A1* | 5/2007 | Yamada et al. | 422/243 |
| 2007/0266932 A1* | 11/2007 | Hiramatsu | 117/88 |
| 2008/0110401 A1* | 5/2008 | Fujikawa et al. | 118/724 |
| 2009/0311430 A1* | 12/2009 | Ito | 427/314 |
| 2010/0029066 A1* | 2/2010 | Miyashita | 438/478 |
| 2010/0129990 A1* | 5/2010 | Nishizawa et al. | 438/478 |

FOREIGN PATENT DOCUMENTS

| | | | | |
|---|---|---|---|---|
| EP | 0 870 852 A1 | 10/1998 | | |
| JP | 7-193015 | 7/1995 | | |
| JP | 11-45861 | 2/1999 | | |
| JP | 2000-331939 | 11/2000 | | |
| JP | 2001-44125 | 2/2001 | | |
| JP | 2002-198316 | 7/2002 | | |
| JP | 2002198316 A * | 7/2002 | | H01L 21/205 |
| JP | 2002-231641 | 8/2002 | | |
| JP | A-2003-168650 | 6/2003 | | |

* cited by examiner

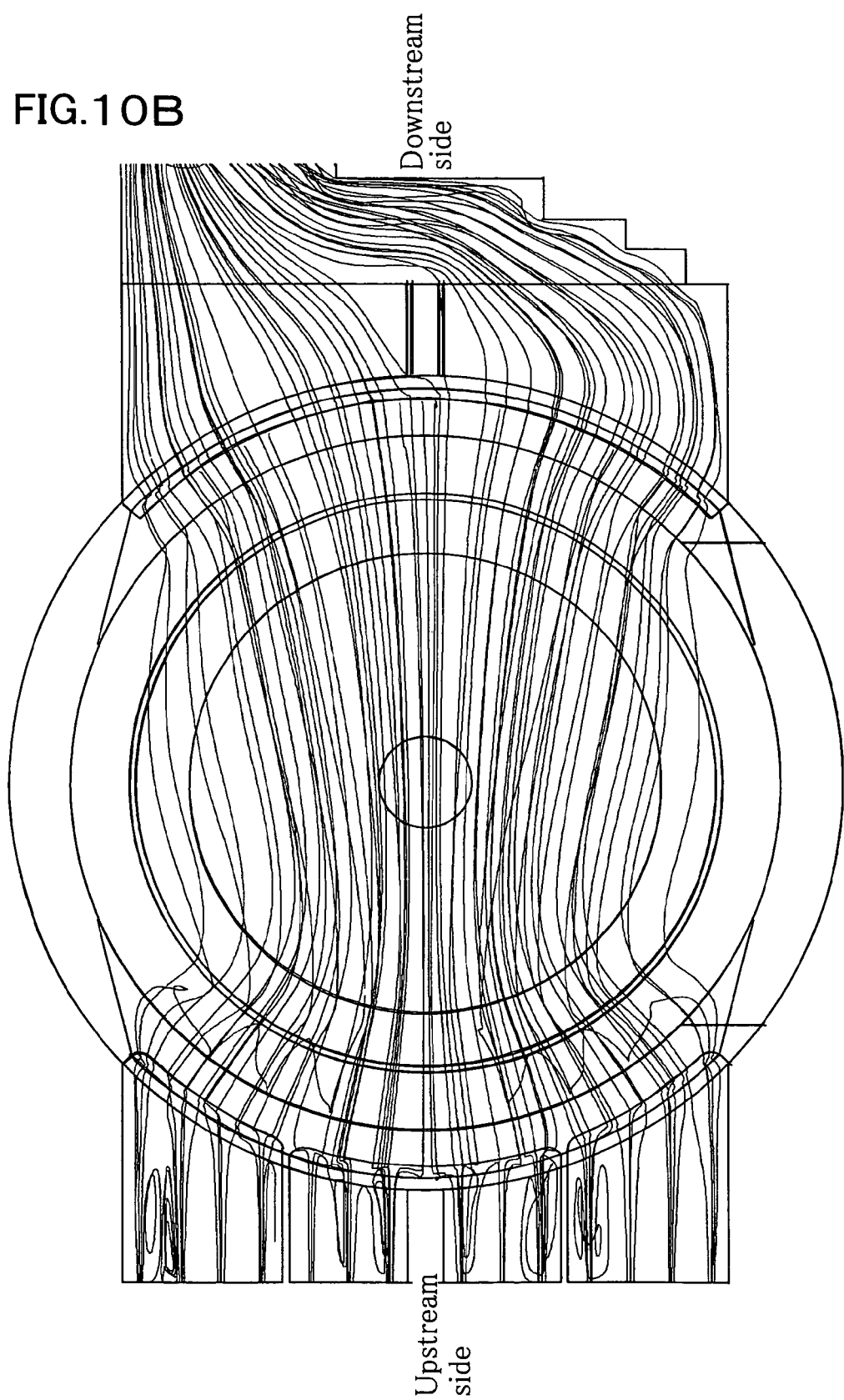

VAPOR PHASE GROWTH APPARATUS AND METHOD OF FABRICATING EPITAXIAL WAFER

BACKGROUND OF THE INVENTION

1. Field of the Invention

This invention relates to a vapor phase growth apparatus allowing vapor phase growth of a silicon single crystal film on the main surface of a silicon single crystal substrate to proceed therein, and a method of fabricating an epitaxial wafer realized using the same.

2. Description of the Related Art

Silicon epitaxial wafer having a silicon single crystal film (simply referred to as "film", hereinafter) grown in vapor phase on the main surface of a silicon single crystal substrate (simply referred to as "substrate", hereinafter) is widely used for electronic devices such as bipolar IC, MOS-IC and so forth. With advancement in micronization of the electronic devices, requirement for flatness of the main surface of the epitaxial wafer in which the devices are fabricated has been becoming more stringent. Causal factors affecting the flatness include flatness of the substrate and distribution of the film thickness. In recent years, single-wafer-type vapor phase growth apparatus has become a mainstream in fabrication of epitaxial wafers having a diameter of 200 mm or more, in place of batch processing of a plurality of wafers. The apparatus holds a single substrate in a horizontally rotating manner in a reaction vessel, while allowing a source gas to flow from one end to the other end of the reaction vessel in a horizontal and unidirectional manner, to thereby proceed vapor phase growth of the film.

One important factor in view of making the resultant film thickness uniform in the above-described single-wafer-type vapor phase growth apparatus is flow rate, or flow rate distribution of the source gas in the reaction vessel. The single-wafer-type vapor phase growth apparatus is generally configured as introducing the source gas through a gas supply duct and through a gas introducing port formed on one end of the reaction vessel, allowing the source gas to flow along the surface of a substrate, and discharging the source gas through a discharging port on the other end of the vessel. In order to reduce non-uniformity in the flow rate in thus-configured vapor phase growth apparatus, proposals have been made on an apparatus having a dispersion plate with a large number of through holes formed therein, disposed on the downstream side of the gas introducing port, and an apparatus having disposed therein a partition plate partitioning the gas flow in the width-wise direction.

Japanese Laid-Open Patent Publication "Tokkaihei" No. 7-193015 discloses a configuration of an apparatus allowing the source gas supplied through the gas introducing port to flow towards the outer peripheral surface of a bank component disposed around a susceptor holding a substrate, so as to supply the source gas onto the surface of a substrate after climbing up the bank component. A basic concept of this method is to diffuse the source gas by allowing the flow thereof to collide against the outer peripheral surface of the bank component, to thereby resolve non-uniformity in the flow rate. Another proposal has been made on this sort of vapor phase growth apparatus having the bank component improved so as to allow the source gas to flow more smoothly towards the susceptor (Japanese Laid-Open Patent Publication "Tokkai" No. 2002-231641). Still another proposal has been made on the vapor phase growth apparatus improved so as to intentionally make variation in the flow of the source gas on both sides of the susceptor (Japanese Laid-Open Patent Publication "Tokkai" No. 2002-198316).

Typical known problems in the vapor phase epitaxial growth of the silicon single crystal film on the silicon single crystal substrate include deformation of patterns. Several factors affecting the pattern deformation have been known, wherein the degree of pattern deformation can be reduced generally by lowering pressure in the reaction vessel so as to increase a diffusion coefficient of HCl gas produced on the surface of the substrate, to thereby depress the etching action by the HCl gas. For this reason, a reduced pressure condition is preferably applied to vapor phase growth on the silicon single crystal substrate having patterns already formed thereon.

Epitaxial growth under a reduced pressure condition using the apparatus such as described in the aforementioned Japanese Laid-Open Patent Publication "Tokkaihei" No. 7-193015 may, however, sometimes encounter a difficulty in obtaining a desired distribution of film thickness.

It is therefore an object of this invention to provide a vapor phase growth apparatus capable of uniformalizing the flow route of the source gas flowing over the silicon single crystal substrate, and a method of fabricating an epitaxial wafer using the same, aiming at ensuring a desirable distribution of film thickness.

Patent Document 1: Japanese Laid-Open Patent Publication "Tokkaihei" No. 7-193015;
Patent Document 2: Japanese Laid-Open Patent Publication "Tokkai" No. 2002-231641; and
Patent Document 3: Japanese Laid-Open Patent Publication "Tokkai" No. 2002-198316.

SUMMARY OF THE INVENTION

In the vapor phase growth apparatus configured as disclosed in the above documents, a gas introducing gap 60', as indicated by the hatched line in FIG. 8, is formed by a bank component surrounding a susceptor and an upper lining component disposed right above the bank component. On the other hand, the source gas G introduced into the vapor phase growth apparatus tends to flow so as to minimize as possible the frictional resistance. As it can be understood from FIG. 8, assuming now that source gas G flows nearly in parallel with the horizontal standard line HSL, the source gas G flows across a longer path of the gas introducing gap 60' at a position more largely distant from the horizontal standard line HSL. The stream of the source gas G flowing more largely distant from the horizontal standard line HSL, therefore, tends to inwardly deflect the direction of flow to a larger degree, in the vicinity of an exit of the gas introducing gap 60'. This is one cause for raising difficulty in uniformalizing the flow route of the source gas flowing over the silicon single crystal substrate.

The present inventors having been aware of this problem went through extensive investigations, to finally complete this invention described below. That is, a vapor phase apparatus of this invention is a vapor phase growth apparatus allowing vapor phase growth of a silicon single crystal film on the main surface of a silicon single crystal substrate to proceed therein, having a reaction vessel having a gas introducing port formed on a first end side in the horizontal direction, and having a gas discharging port on a second end side in the same direction, configured as allowing a source gas for forming the silicon single crystal film to be introduced through the gas introducing port into the reaction vessel, and to flow along the main surface of the silicon single crystal substrate held in a near-horizontally rotating manner in the inner space of the reaction vessel, and to be discharged through the gas discharging port, the silicon single crystal substrate being disposed on a disc-formed susceptor rotated in the inner space, and having a bank component disposed so as to surround the susceptor, and kept in a positional relation so as to align the top surface thereof at an almost same level with the top surface of the susceptor, further configured so that the gas introducing port is opened so as to oppose to the outer peripheral surface of the bank component, so as to allow the source gas supplied through the gas introducing port to collide against the outer peripheral surface of the bank component and to climb up onto the top surface side thereof, and then to flow along the main surface of the silicon single crystal substrate on the susceptor, and further comprising an upper lining component disposed so as to hang over the bank component, while forming a gas introducing gap communicated with the reaction vessel by the bank component and the upper lining component; wherein, assuming a virtual center line along the direction of flow of the source gas, extending from the first end of the reaction vessel towards the second end, while crossing normal to the axis of rotation of the susceptor, as the horizontal standard line, and also assuming the direction normal to both of the axis of rotation of the susceptor and the horizontal standard line as the width-wise direction, the gas introducing gap is configured so that the length-to-be-formed thereof in the parallel direction with the horizontal standard line is decreased in a continuous or step-wise manner as distanced from the horizontal standard line in the width-wise direction, or remained constant at any position.

The vapor phase growth apparatus of this invention is such as forming a flow passageway of the source gas, flowing up over the susceptor disposed in the reaction vessel, by the bank component (lower liner) and the upper lining component (upper liner). As described in the above, the source gas flowing through the apparatus tends to flow while selecting a position where the frictional resistance can be minimized as possible. The vapor phase growth apparatus of this invention is adjusted so as to decrease the length of the gas introducing gap as distanced from the horizontal standard line in the width-wise direction, or remained constant at any position. The flow of the source gas is, therefore, prevented from largely changing from the direction of the horizontal standard line, where distanced from the horizontal standard line. As a consequence, a vapor phase growth apparatus capable of forming a silicon single crystal film having a desirable thickness distribution can be realized.

In one preferred embodiment, the above-described vapor phase growth apparatus may be configured so that the degree of overlapping, in the vertical direction, of the top surface of the bank component forming the gas introducing gap and the lower surface of the lining component forming the same is reduced as distanced from the horizontal standard line in the width-wise direction, or remained constant at any position. This configuration allows adjustment of the length-to-be-formed of the gas introducing gap through adjustment of the degree of overlapping between the bank component and the upper lining component, and is therefore readily adaptive to any changes in design and so forth.

The inner periphery of the lower surface of the upper lining component may be located on the upstream side, in the direction of flow of the source gas, rather than on the inner periphery of the top surface of the bank component. It is necessary for the source gas to flow over the top surface of the bank component, and to be smoothly guided onto the top surface of the susceptor. According to the above-described configuration, the end of the gas introducing gap can be fixed at the position of the inner periphery of the lower surface of the upper lining component, so that the length-to-be-formed of the gas introducing gap can be adjusted while ensuring smooth guidance of the source gas onto the top surface of the susceptor.

It is also desirable that the vapor phase growth apparatus is configured so that, on the exit side of the gas introducing gap, the center of an arc drawn by the inner periphery of the top surface of the bank component coincides with the axis of rotation of the susceptor, and so that the center of an arc drawn by the inner periphery of the lower surface of the upper lining component is set on the downstream side, in the direction of flow of the source gas, rather than on the axis of rotation of the susceptor, and so that the radius of the arc drawn by the inner periphery of the lower surface of the upper lining component is set larger than the radius of arc drawn by the inner periphery of the top surface of the bank component. These features can conceptually be illustrated in FIG. 7. The hatched portion in FIG. 7 expresses a region of formation of the gas introducing gap. That is, the above-described configuration more specifically shows a configuration in which the length-to-be-formed of the gas introducing gap (the length-to-be-formed in the direction along the horizontal standard line HSL) is gradually reduced as distanced from the horizontal standard line HSL.

The vapor phase growth apparatus of this invention as viewed from another viewpoint is a vapor phase growth apparatus allowing vapor phase growth of a silicon single crystal film on the main surface of a silicon single crystal substrate to proceed therein, having a reaction vessel having a gas introducing port formed on a first end side in the horizontal direction, and having a gas discharging port on a second end side in the same direction, configured as allowing a source gas for forming the silicon single crystal film to be introduced through the gas introducing port into the reaction vessel, and to flow along the main surface of the silicon single crystal substrate held in a near-horizontally rotating manner in the inner space of the reaction vessel, and to be discharged through the gas discharging port, the silicon single crystal substrate being disposed on a disc-formed susceptor rotated in the inner space, and having a bank component disposed so as to surround the susceptor, and kept in a positional relation so as to align the top surface thereof at an almost same level with the top surface of the susceptor, further configured so that the gas introducing port is opened so as to oppose to the outer peripheral surface of the bank component, so as to allow the source gas supplied through the gas introducing port to collide against the outer peripheral surface of the bank component and to climb up onto the top surface side thereof, and then to flow along the main surface of the silicon single crystal substrate on the susceptor, and further having an upper lining component disposed so as to hang over the bank component, while forming a gas introducing gap communicated with the reaction vessel by the bank component and the upper lining component; configured so that the inner periphery of the lower surface of the upper lining component is located on the upstream side, in the direction of flow of the source gas, rather than the inner periphery of the top surface of the bank component, so that, on the exit side of the gas introducing gap, the center of an arc drawn by the inner periphery of the top surface of the bank component coincides with the axis of rotation of the susceptor, and so that the center of an arc drawn by the inner periphery of the lower surface of the upper lining component is set on the downstream side, in the direction of flow of the source gas, rather than the axis of rotation of the susceptor, and so that the radius of the arc drawn by the inner periphery of the lower surface of the upper lining component is set larger than the radius of the arc drawn by the inner periphery of the top surface of the bank component.

As described in the above, the source gas flowing through the apparatus tends to flow while selecting a position where the frictional resistance can be minimized as possible. An essential portion of the vapor phase growth apparatus of this invention can conceptually be illustrated in FIG. 7. The hatched portion in FIG. 7 expresses an area of formation of the gas introducing gap. It is assumed now that a virtual center line along the direction of flow of the source gas G, extending from the first end of the reaction vessel towards the second end, while crossing normal to the axis of rotation O of the susceptor as the horizontal standard line HSL, and that the direction normal to both of the axis of rotation O of the susceptor and the horizontal standard line HSL as the widthwise direction WL. Because radius $R_3$ of an arc drawn by the inner periphery 40$p$ of the lower surface of the upper lining component is set larger than radius $R_1$ of an arc drawn by the inner periphery 23$p$ of the top surface of the bank component, the length-to-be-formed of the gas introducing gap with respect to the direction along the horizontal standard line HSL is prevented from increasing as distanced from the horizontal standard line HSL. The source gas G, therefore, does not largely vary the direction of flow even at a position distant from the horizontal standard line HSL. This is because the source gas G flowing in the gas introducing gap tends to flow along a route minimizing the resistance, that is, along a route on which the gas introducing gap has a short path. As a consequence, the source gas enables to flow even more uniformly also around the outer periphery of the susceptor. In other words, non-uniformity in the flow route of the source gas on the substrate can be dissolved, and thereby a vapor phase growth apparatus capable of forming a silicon single crystal film with a desirable thickness distribution can be realized.

It is also possible to provide the vapor phase growth apparatus with an evacuation system keeping the inner space of the reaction vessel under a reduced pressure lower than the atmospheric pressure. This configuration allows epitaxial growth under a reduced pressure condition contributive to reduction in the degree of pattern deformation, when it is desired to proceed the vapor phase growth on a substrate having patterns already formed thereon.

A method of fabricating an epitaxial wafer of this invention is such as disposing the silicon single crystal substrate in the reaction vessel of the above-described vapor phase growth apparatus, and allowing the source gas to flow in the reaction vessel so as to epitaxially grow a silicon single crystal film on the silicon single crystal substrate in a vapor phase, to thereby obtain an epitaxial wafer.

The silicon single crystal film can epitaxially be grown on the silicon single crystal substrate in vapor phase, by using any one gas selected from the group consisting of monochlorosilane gas, dichlorosilane gas and trichlorosilane gas as the source gas for the vapor phase epitaxial growth, while keeping the inner space of the reaction vessel under a reduced pressure lower than the atmospheric pressure.

It is also preferable to set the degree of opening of an inner valve regulating flow rate of the source gas flowing closer to the horizontal standard line, and an outer valve regulating flow rate of the source gas flowing more distant from the horizontal standard line, corresponding to the length-to-be-formed of the gas introducing gap in the direction in parallel with the horizontal standard line. According to this configuration, any non-conformity in the flow rate of the source gas over the substrate can be reduced, as a result of synergistic effect of the above-described configuration of the vapor phase growth apparatus of this invention.

It is denoted herein that the top surface of the bank component is in an almost coincident positional relation with the top surface of the susceptor. This does not always mean that the top surface of the bank component and the top surface of the susceptor are aligned perfectly at the same level, and instead means that positional difference up to 2 mm or around is acceptable.

BRIEF DESCRIPTION OF THE DRAWINGS

FIG. 10B is a drawing showing a flow route distribution of the source gas in a conventional vapor phase growth apparatus, obtained by a computer simulation;

BEST MODES FOR CARRYING OUT THE INVENTION

Paragraphs below will explain best modes for carrying out this invention, referring to the attached drawings.

Figure 1:
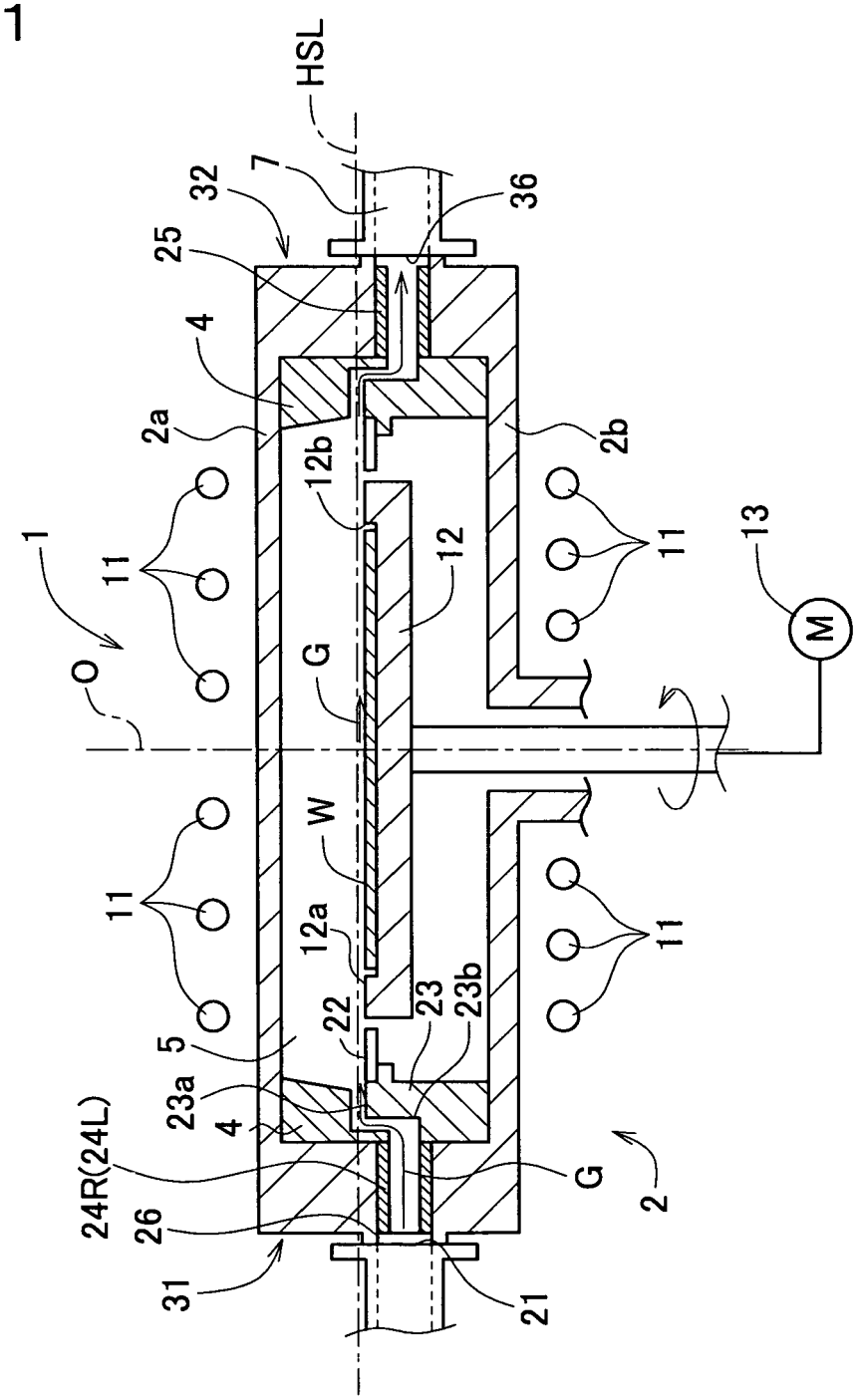
FIG. 1 is a sectional side elevation showing an example of the vapor phase growth apparatus of this invention.
Figure 2:
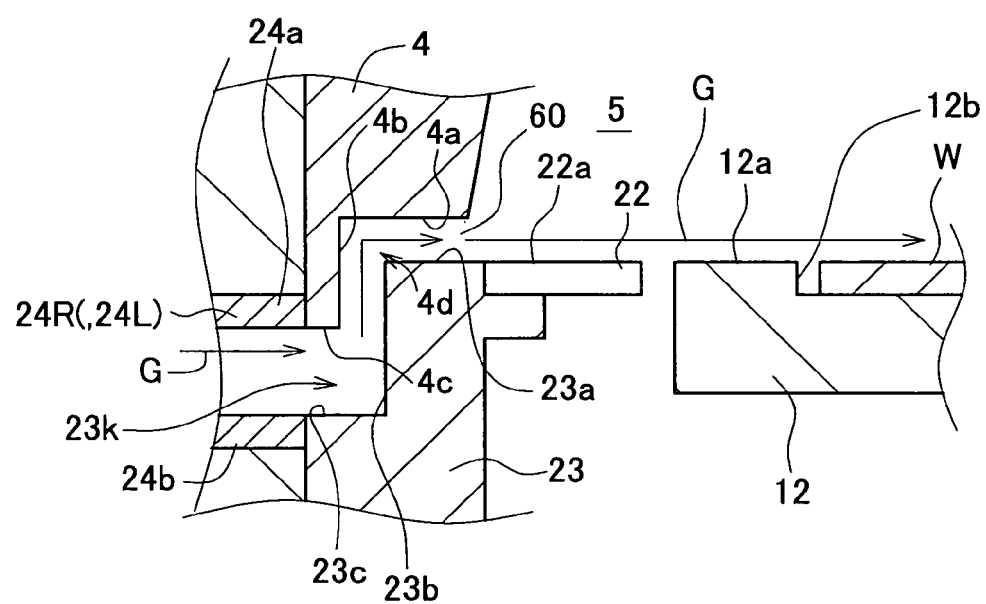
FIG. 2 is an enlarged sectional view showing an essential portion of the vapor phase growth apparatus of this invention.
Figure 3:
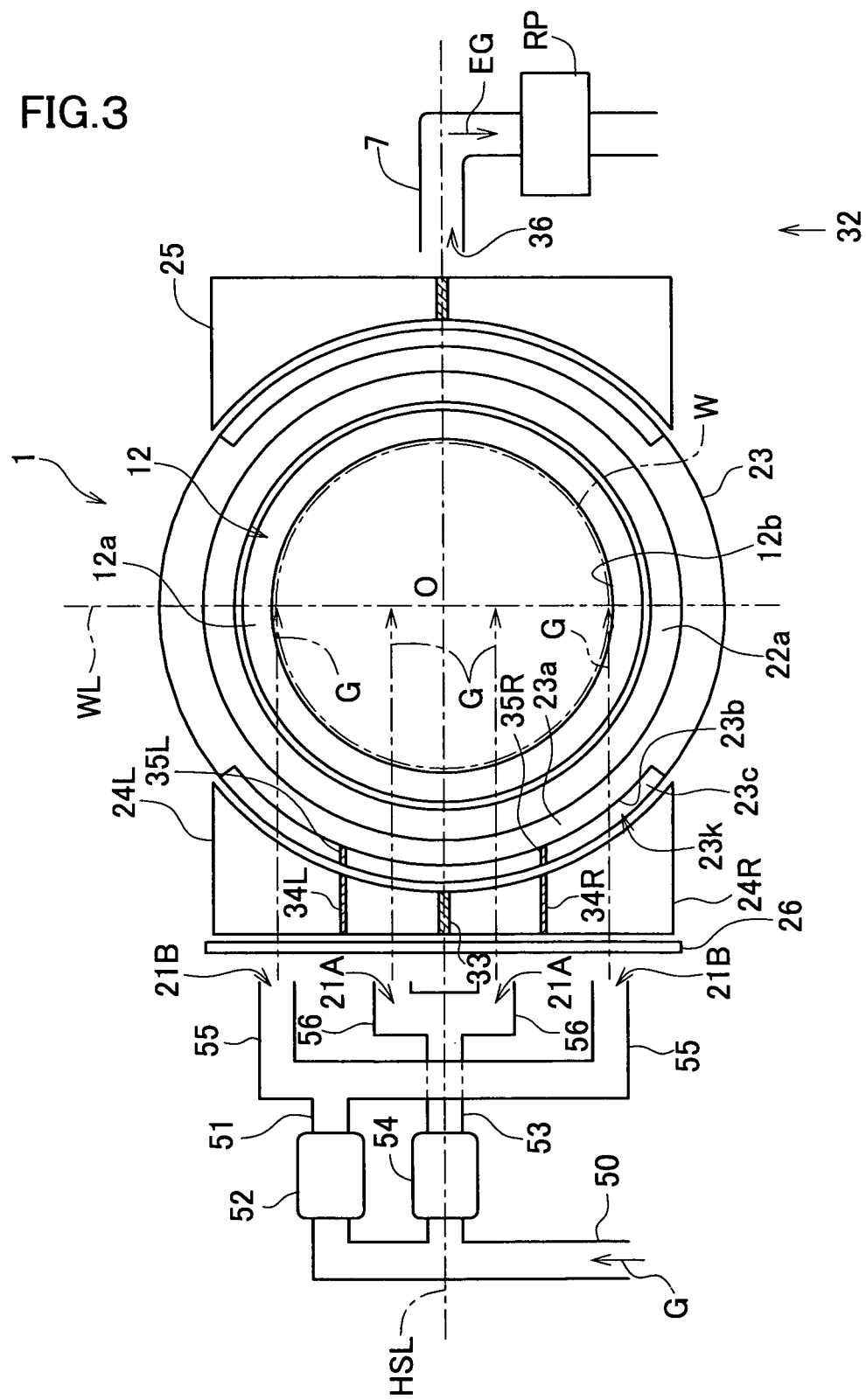
FIG. 3 is a plan view of the vapor phase growth apparatus of this invention.
Figure 4:
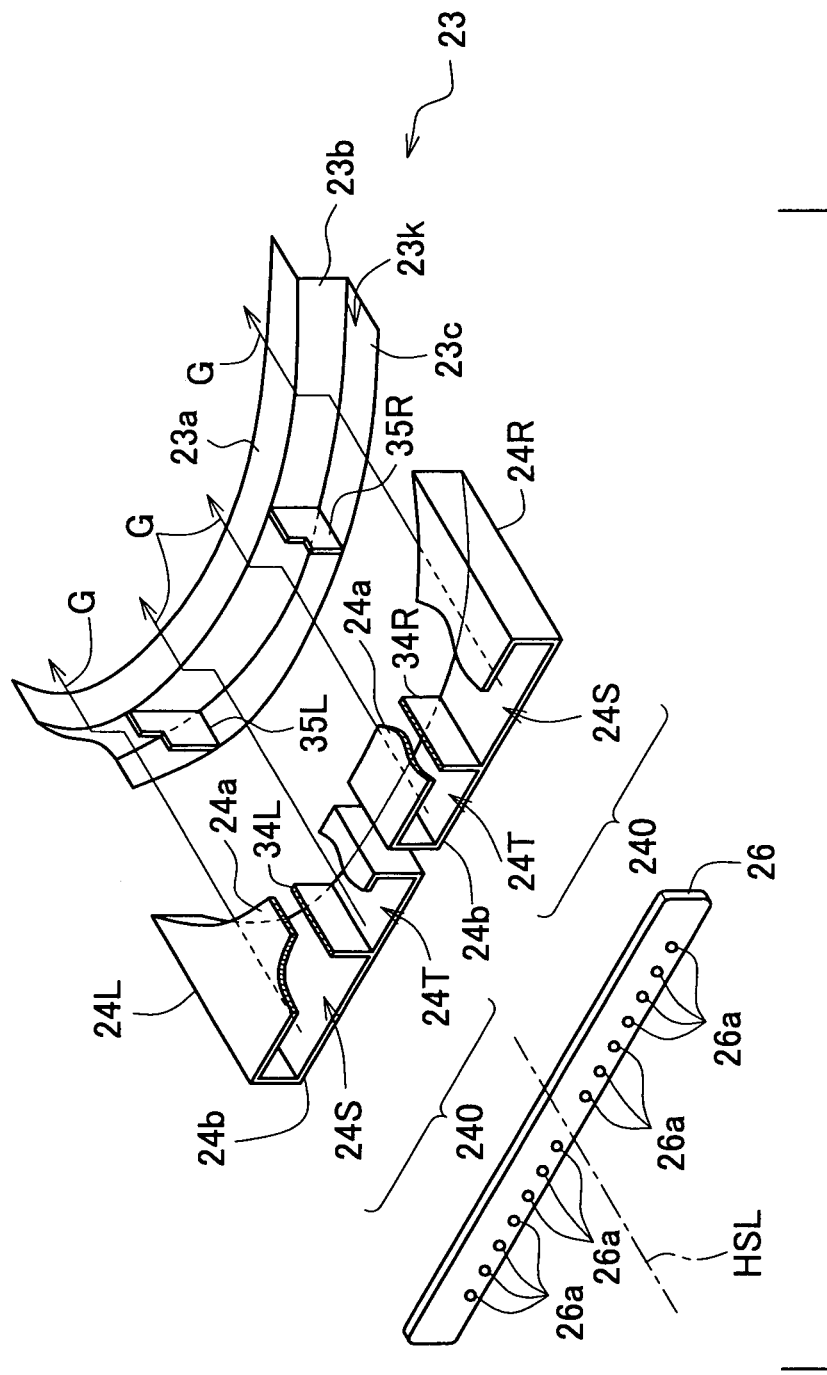
FIG. 4 is an exploded perspective view showing, in a partially cut-off manner, an essential portion of the vapor phase growth apparatus of this invention.

FIGS. 1 to 4 schematically show an exemplary vapor phase growth apparatus 1 of this invention, allowing vapor phase growth of a silicon single crystal film on the main surface of a silicon single crystal substrate to proceed therein. FIG. 1 is a sectional side elevation of the apparatus, FIG. 2 is a partially enlarged view of FIG. 1, FIG. 3 is a plan view of the vapor phase growth apparatus 1, and FIG. 4 is an exploded perspective view showing, in a partially cut-off manner, an essential portion of the vapor phase growth apparatus 1 shown in FIG. 1. As shown in FIG. 1, the vapor phase growth apparatus 1 has a reaction vessel 2 having a gas introducing port 21 formed on a first end 31 side in the horizontal direction, and has a gas discharging port 36 on a second end 32 side of the same direction. The apparatus is configured so as to introduce a source gas G for forming the film through the gas introducing port 21 into the reaction vessel 2, to allow the gas to flow in the direction along the main surface of a substrate W held in a near-horizontally rotating manner in an inner space 5 of the reaction vessel 2, and to discharge the gas from the gas discharging port 36 through an exhaust duct 7. The exhaust duct 7 configures an evacuation system of the vapor phase growth apparatus 1, together with a pressure-reducing pump RP (FIG. 3).

As shown in FIG. 1, in the inner space 5 of the reaction vessel 2, there is disposed a disc-formed susceptor 12 rotatively driven by a motor 13 around a vertical axis of rotation O, and only a single slice of substrate W for fabricating a silicon epitaxial wafer is disposed in a shallow spot facing 12b formed on the top surface of the susceptor 12. That is, the vapor phase growth apparatus 1 is configured as a single-wafer-type apparatus. The substrate W typically has a diameter of 100 mm or larger. On the upper and lower sides of the reaction vessel 2, infrared heating lamps 11 for heating the substrate are disposed at regular intervals corresponding to the region where the substrate W is placed.

In the internal space 5 of the reaction vessel 2, a bank component 23 is disposed so as to surround the susceptor 12, as shown in FIG. 3. The bank component 23 is disposed so as to align a top surface 23a thereof at an almost same level with a top surface 12a of the susceptor 12 (and consequently the main surface of the substrate W), as shown in FIG. 2. The gas introducing port 21 is opened, as shown in FIG. 1, so as to oppose to an outer peripheral surface 23b of the bank component 23, so as to allow the source gas G supplied through the gas introducing port 21 to collide against the outer peripheral surface 23b of the bank component 23, and to climb up onto the top surface 23a side thereof, and then to flow along the main surface of the substrate W on the susceptor 12, as shown in FIG. 2 or FIG. 4. In this embodiment, the outer peripheral surface 23b of the bank component 23 is configured as a cylindrical surface conforming to the geometry of the susceptor 12. Along the inner periphery of the bank component 23, a plate-formed preheating ring 22 for soaking is disposed, wherein the top surface 12a of the susceptor 12 disposed inside thereof is aligned at an almost same level with a top surface 22a (see FIG. 2) of the preheating ring 22. In the inner space 5, there is also disposed an upper lining component 4 having a diameter almost same as that of the bank component 23, at a position opposing to the bank component 23. Both of the bank component 23 and the upper lining component 4 are ring-formed components made of a quartz material.

In the vapor phase growth apparatus 1, as shown in FIG. 1, a virtual center line along the direction of flow of the source gas G, extending from the first end 31 of the reaction vessel 2 towards the second end 32, while crossing normal to the axis of rotation O of the susceptor 12, is assumed as a horizontal standard line HSL. The direction normal to both of the horizontal standard line HSL and the axis of rotation O of the susceptor 12 is assumed as a width-wise direction WL (FIG. 3).

As shown in FIG. 3, gas introducing components 24R, 24L, introducing the source gas G supplied through gas introducing ports 21A, 21B towards the outer peripheral surface 23b of the bank component 23, are disposed between the gas introducing port 21 (21A, 21B) and the bank component 23 as being symmetrically distributed with respect to the horizontal standard line HSL on both sides thereof (more specifically, on the left and right of a pillar 33 of the reaction vessel 2). The gas introducing components 24R, 24L are further provided with, in each of gas introducing spaces 240, 240 (FIG. 4) formed inside thereof, gas-introducing-component-side partition plates 34R, 34L further partitioning the flow of the source gas G in the width-wise direction WL. By such configuration, the gas introducing spaces 240, 240 are divided into gas introducing spaces 24T, 24T closer to the horizontal standard line HSL and spaces 24S, 24S more distant from the horizontal standard line HSL.

On the other hand, on the outer peripheral surface 23b of the bank component 23, as shown in FIG. 3, there are disposed bank-component-side partition plates 35R, 35L partitioning the flow of the source gas G into a plurality of streams in the width-wise direction WL, as being symmetrically distributed with respect to the horizontal standard line HSL. The source gas G tends to escape in the width-wise direction WL when the source gas G climbs up onto the top surface 23a of the bank component 23. Provision of the bank-component-side partition plates 35R, 35L together with the above-described, gas-introducing-component-side partition plates 34R, 34L is successful in controlling the flow of the source gas G in the width-wise direction WL. In this embodiment, the bank-component-side partition plates 35R, 35L are disposed one by one on both sides of the horizontal standard line HSL. Therefore, a resultant mode of disposition is such as having the gas-introducing-component-side partition plates 34R, 34L and the bank-component-side partition plates 35R, 35L respectively aligned in the same plane in parallel with the horizontal standard line HSL and the axis of rotation O.

As shown in FIG. 3, the gas introducing ports 21A, 21B are formed so as to correspond with the gas introducing components 24R, 24L, respectively. A gas duct 50 branches into an inner duct 53 supplying the gas towards the gas introducing spaces 24T (FIG. 4) closer to the horizontal standard line HSL and an outer duct 51 supplying gas towards the gas introducing spaces 24S (FIG. 4) more distant from the horizontal standard line HSL, allowing independent control of flow rate of the source gas G respectively by mass flow controllers (MFC) 54, 52. It is also allowable herein to use manual valves in place of the MFCs 54, 52. The inner duct 53 and the outer duct 51 are further divided into branched ducts 56, 56 and branched ducts 55, 55, respectively, having inner gas introducing ports 21A, 21A and outer gas introducing ports 21B, 21B opened on both sides of the horizontal standard line HSL.

As shown in FIG. 4, the gas introducing components 24R, 24L are quartz-made cylindrical components each having an oblong section, and being opened respectively on the gas introducing port 21 side and on the bank component side 23. The gas-introducing-component-side partition plates 34R, 34L are disposed respectively in the individual inner spaces of the gas introducing components 24R, 24L, so as to extend from top plates 24a to bottom plates 24b disposed nearly in parallel with each other. By virtue of such disposition of the gas introducing components 24R, 24L, integrated with the gas-introducing-component-side partition plates 34R, 34L, in a detachable manner with respect to the reaction vessel 2, any alteration for example of location of the gas-introducing-component-side partition plates 34R, 34L can readily be accomplished simply by exchanging the gas introducing components 24R, 24L.

As shown in FIG. 3, a baffle 26 is disposed between the gas introducing ports 21A, 21B and the gas introducing component 24R, 24L. The baffle 26 is formed with an oblong geometry corresponded to the openings of the gas introducing components 24R, 24L as shown in FIG. 4, and has a plurality of gas passage holes 26a formed therein at regular intervals in the longitudinal direction. The gas passage holes 26a are formed at positions not interfering the gas-introducing-component-side partition plates 34R, 34L. As shown in FIG. 3, a discharge-side gas guiding component 25 is disposed between the bank component 23 and the gas discharging port 36.

The bank component 23 has a bow-formed cut-off portion 23k, as shown in FIG. 4, formed by notching the outer peripheral portion of the top surface 23a of the bank component 23 in a recess-forming manner, in a sector opposing to the gas introducing components 24R, 24L. The side face of the cut-off portion 23k forms a part of the outer peripheral surface 23b of the bank component 23. The reaction vessel 2 is composed of a lower vessel 2b and an upper vessel 2a as shown in FIG. 1, and the upper lining component 4 and the bank component 23 are disposed along the inner peripheral surfaces of the upper vessel 2a and a lower vessel 2b, respectively. As shown in FIG. 2, a lower surface 23c of the cut-off portion 23k is aligned at an almost same level with an extension of the inner surfaces of the bottom plates 24b of the gas introducing components 24R, 24L, and plays a role of a gas introducing surface. The source gas G collides against the side face 23b of the cut-off portion 23k, and climbs up onto the top surface 23a.

As shown in FIG. 2, the upper lining component 4 has a step portion 4d composed of a first lower surface 4a opposing parallel to the top surface 23a of the bank component 23, an inner peripheral surface 4b opposing to the side face 23b (outer peripheral surface of the bank component 23) of the cut-off portion 23k, and a second lower surface 4c opposing in parallel with the lower surface 23c of the same, so as to form, between itself and the cut-off portion 23k, a gas introducing gap 60 having a crank-shape section. That is, the gas introducing gap 60 is a gas passageway formed by opposing the bank component 23 and the upper lining component 4. As shown in FIG. 4, the bank-component-side partition plates 35R, 35L are formed to be almost L-shaped conforming to the profile of the gas introducing gap 60.

Figure 5:
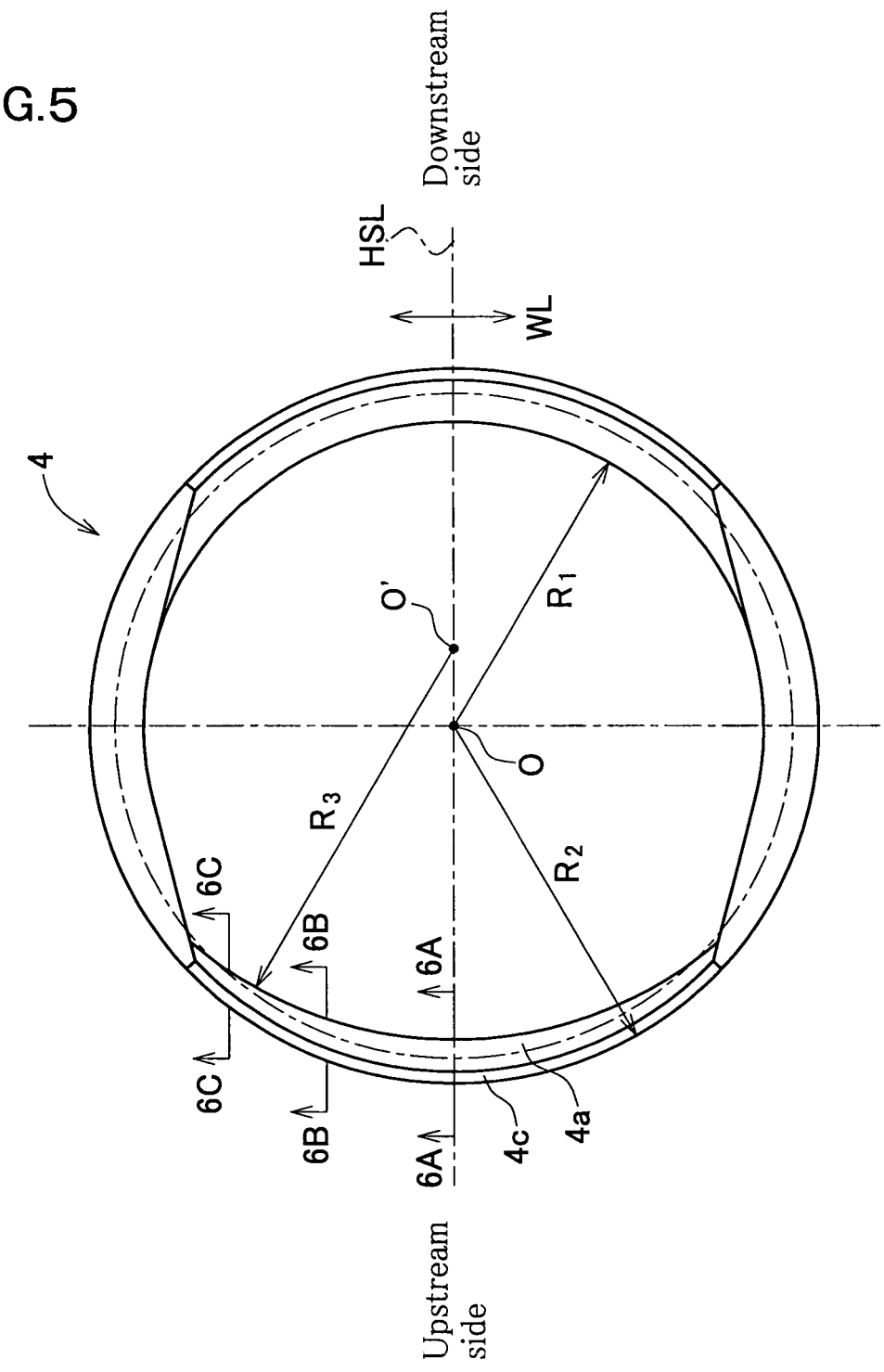
FIG. 5 is a bottom plan view of the upper lining component.

FIG. 5 is a bottom plan view of the upper lining component 4 as viewed from the bank component 23 side. The first lower surface 4a and the second lower surface 4c opposing to the bank component 23 form the gas introducing gap 60. The length-to-be-formed of the gas introducing gap 60 in the parallel direction to the horizontal standard line HSL is set depending on the degree of overlapping of the upper lining component 4 and the bank component 23 in the vertical direction. The vapor phase growth apparatus 1 of this invention is configured so as to gradually reduce the length-to-be-formed as distanced from the horizontal standard line HSL in the width-wise direction WL.

Figure 6A:
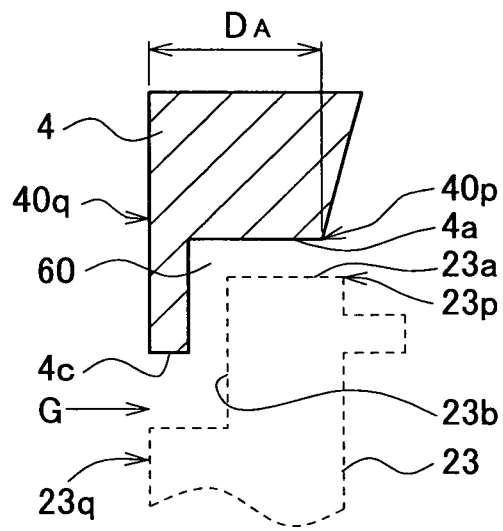
FIG. 6A is a sectional view taken along line 6A-6A containing the horizontal standard line HSL shown in FIG. 5, for explaining a mode of formation of the gas introducing gap.
Figure 6B:
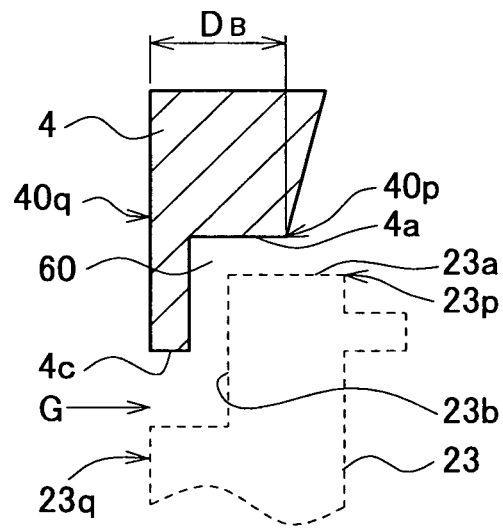
FIG. 6B is a sectional view taken along line 6B-6B shown in FIG. 5, for explaining a mode of formation of the gas introducing gap.
Figure 6C:
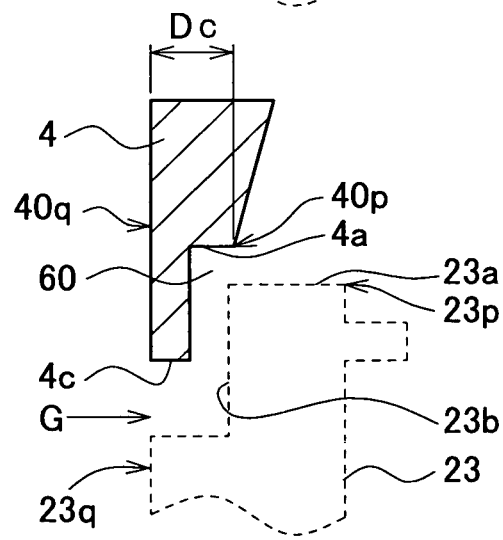
FIG. 6C is a sectional view taken along line 6C-6C shown in FIG. 5, for explaining a mode of formation of the gas introducing gap.

FIG. 6A is a 6A-6A section containing the horizontal standard line HSL shown in FIG. 5, FIG. 6B is a 6B-6B section, and FIG. 6C is a 6C-6C section. In this embodiment, the length-to-be-formed of the gas introducing gap 60 is adjusted based on dimension of an inner periphery 40p of the lower surface 4a of the upper lining component 4, located on the upstream side, in the direction of flow of the source gas G, rather than the inner periphery 23p of the top surface 23a of the bank component 23. In other words, as is clear from FIG. 6A, FIG. 6B and FIG. 6C when viewed in this order, the degree of overlapping, in the vertical direction, of the top surface 23a of the bank component 23 forming the gas introducing gap 60 and the lower surface 4a of the upper lining component 4 forming the same decreases as distanced from the horizontal standard line HSL in the width-wise direction WL. The length-to-be-formed of the gas introducing gap 60 in the direction along the horizontal standard line HSL thus gradually decreases. Assuming now the lengths-to-be-formed appear in the 6A-6A section, the 6B-6B section and the 6C-6C section as $D_A$, $D_B$ and $D_C$, respectively, a relation of $D_A > D_B > D_C$ is true.

As shown in the individual sectional views in FIG. 6A, FIG. 6B and FIG. 6C, an outer periphery 23q of the bank component 23 and an outer periphery 40q of the upper lining component 4 are vertically aligned on the entrance side for the source gas G of the gas introducing gap 60. This configuration facilitates connection of the gas introducing components 24R, 24L as the gas passageways to the bank component 23 and the upper lining component 4, without generating gaps therebetween.

Figure 7:
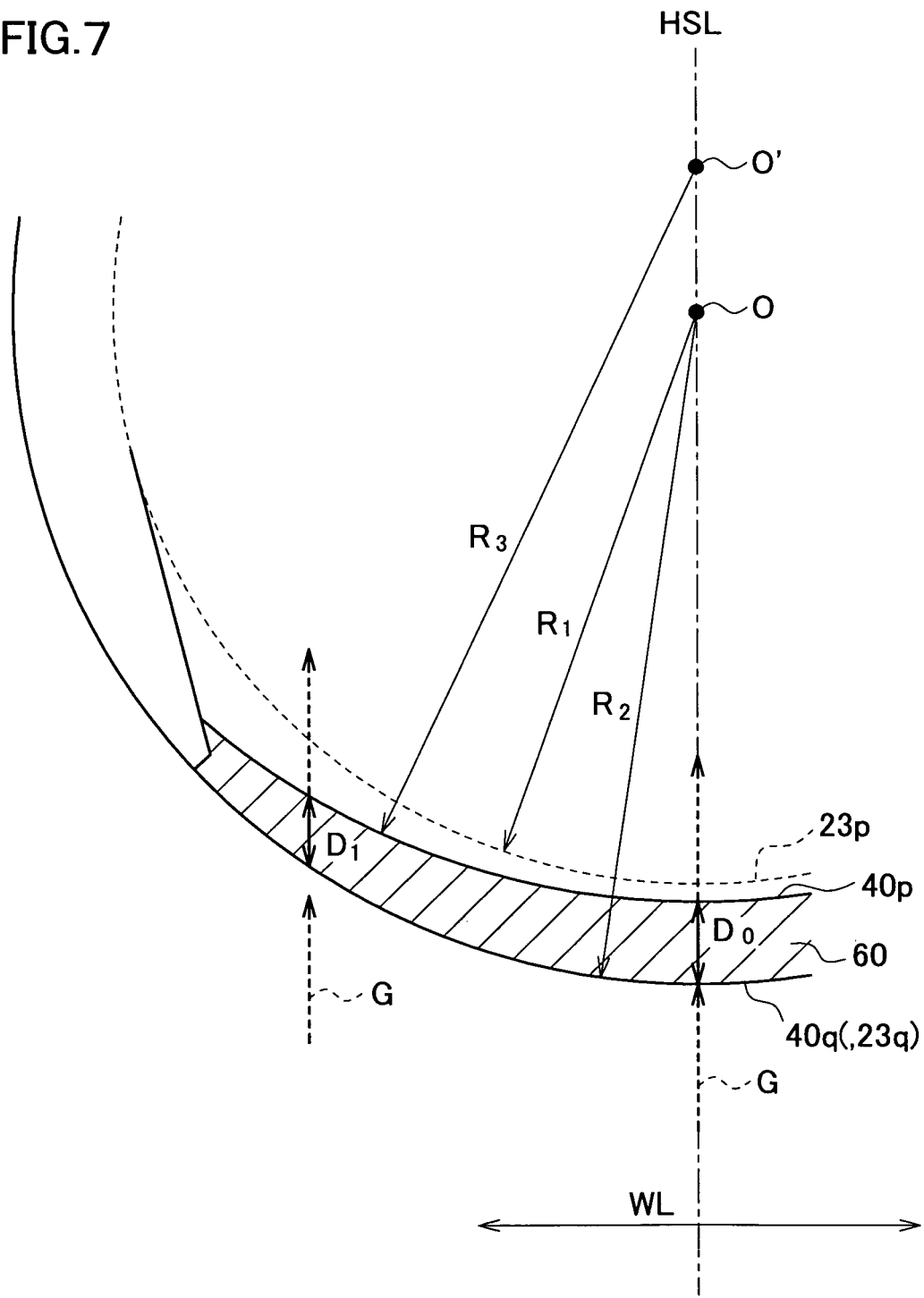
FIG. 7 is a projected plan view showing an area of formation of the gas introducing gap.

FIG. 7 is a projected plan view showing an area of formation of the gas introducing gap 60. In FIG. 7, the gas introducing gap 60 is expressed by a hatched portion. As shown in FIG. 7, on the entrace side of the gas introducing gap 60, an arc drawn by the outer periphery 23q of the bank component 23 and an arc drawn by the outer periphery 40q of the upper lining component 4 coincides in the vertical direction (direction along the axis of rotation O of the susceptor 12). In other words, both arcs have the same radius $R_2$. The center of an arc having radius $R_2$ coincides with the axis of rotation O of the susceptor 12. On the other hand, on the exit side of the gas introducing gap 60, the center of an arc having radius $R_1$ drawn by the inner periphery 23p of the top surface 23a of the bank component 23 coincides with the axis of rotation O of the susceptor 12, but the center O' of an arc having radius $R_3$ drawn by the inner periphery 40p of the lower surface 4a of the upper lining component 4 is set on the downstream side, in the direction of flow of the source gas G, rather than the axis of rotation O of the susceptor 12. The radii of the individual arcs are in a relation of $R_1 < R_3$.

Figure 9:
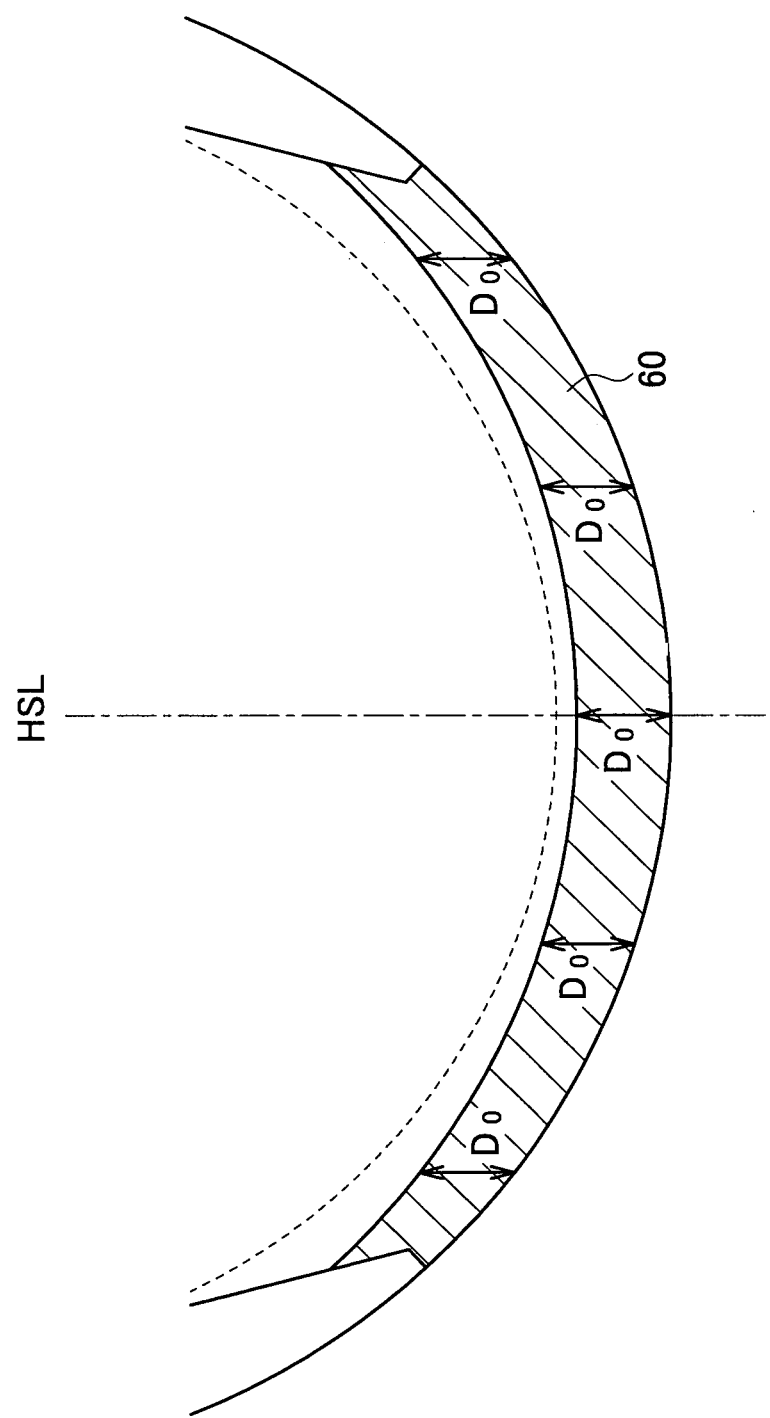
FIG. 9 is a schematic drawing showing another embodiment having a constant length-to-be-formed of the gas introducing gap.

This embodiment showed an exemplary case where the length-to-be-formed of the gas introducing gap 60 gradually decreased as distanced from the horizontal standard line HSL, wherein it is also preferable to adopt another mode of configuration, as schematically shown in FIG. 9, wherein the length-to-be-formed of the gas introducing gap 60 is remained constant Do at any position as distanced from the horizontal standard line HSL in the width-wise direction WL. It is, of course, possible to adjust the dimension of the upper lining component 4 as the length-to-be-formed of the gas introducing gap 60 step-wisely decreases.

The vapor phase growth apparatus 1, as viewed from another point of view, has a configuration as described below. That is, as shown in FIG. 7, on the entrance side of the gas introducing gap 60 (hatched portion), the outer periphery 23q of the bank component 23 and the outer periphery 40q of the upper lining component 4 coincide with each other in the vertical direction (direction along the axis of rotation O of the susceptor 12). On the other hand, on the exit side of the gas introducing gap 60, the center of the arc having radius $R_1$ drawn by the inner periphery 23p of the top surface 23a of the bank component 23 coincides with the axis of rotation O of the susceptor 12, and the center O' of the arc having radius $R_3$ drawn by the inner periphery 40p of the lower surface 4a of the upper lining component 4 is set on the horizontal standard line HSL on the downstream side, in the direction of flow of the source gas G, rather than the axis of rotation L of the susceptor 12. Radii of the individual arcs are adjusted so as to satisfy a relation of $R_1 < R_3$. According to this configuration, the source gas G becomes less likely to deflect towards the horizontal standard line HSL over the top surface 23a of the bank component 23, as compared with the conventional vapor phase growth apparatus.

Paragraphs below will describe a method of fabricating an epitaxial wafer using the above-described vapor phase growth apparatus 1. As shown in FIGS. 1 to 4, the substrate W is placed on the susceptor 12 in the reaction vessel 2, subjected to a pretreatment such as removal of a native oxide film if necessary, and heated under rotation to a predetermined reaction temperature using infrared heating lamps 11. While keeping the condition unchanged, the source gas G is allowed to flow through the individual gas introducing ports 21A, 21B into the reaction vessel 2 at a predetermined flow rate, so as to proceed epitaxial growth of a silicon single crystal film on the substrate W, to thereby obtain an epitaxial wafer.

The source gas G is used for the vapor phase growth of the silicon single crystal film on the substrate W, and is selected from silicon compounds such as $SiHCl_3$, $SiCl_4$, $SiH_2Cl_2$, $SiH_4$ and so forth. The source gas G is appropriately compounded with $B_2H_6$ or $PH_3$ as a dopant gas, or with $H_2$ as a dilution gas, or the like. For the case where the native oxide is removed in advance of the vapor phase growth of the film, a pretreatment gas prepared by diluting a corrosive gas such as HCl with a dilution gas is supplied into the reaction vessel 2, or the substrate W is subjected to high-temperature annealing in a $H_2$ atmosphere.

Operations expectable during the flow of the source gas G in the reaction vessel 2 will be explained below. As indicated by the dashed line with an arrow head in the plan view of FIG. 3, the source gas G flows through the baffle 26 and the gas introducing components 24R, 24L towards the outer peripheral surface 23b of the bank component 23. The source gas collided against the outer peripheral surface 23b then climbs up onto the top surface 23a of the bank component 23, and flows along the main surface of the substrate W. An exhaust gas EG is collected by a discharge-side gas guiding component 25 into the discharge duct 7, and then discharged.

Figure 8:
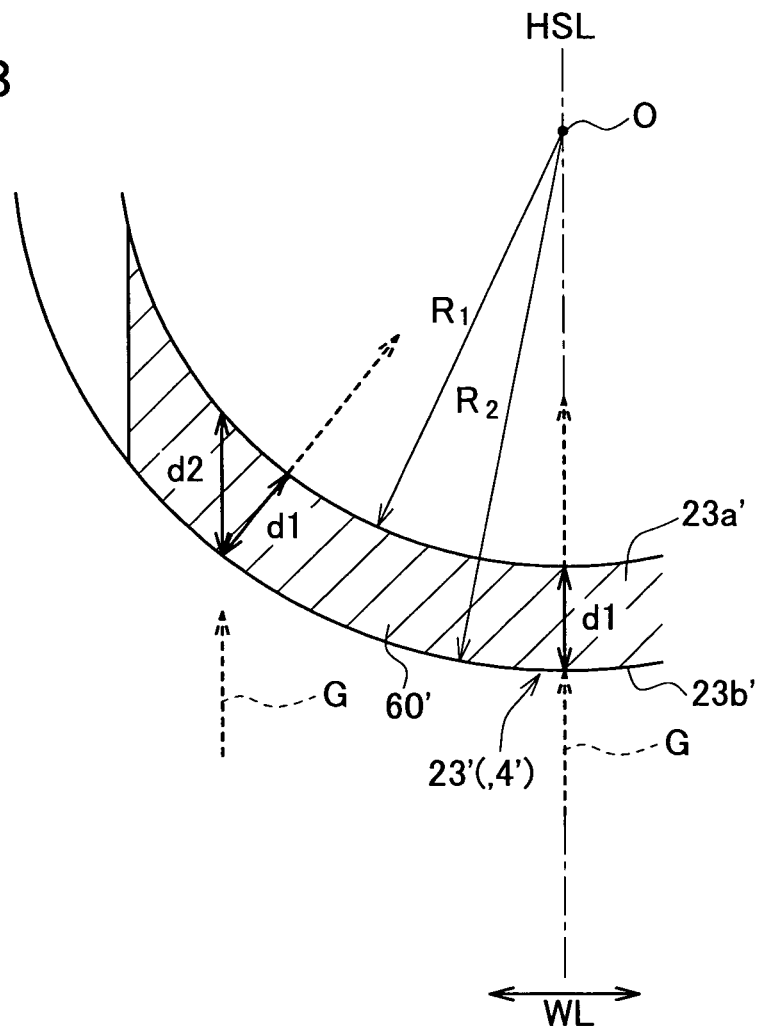
FIG. 8 is a drawing explaining operation of a conventional vapor phase growth apparatus not improved in the upper lining component.

Flow route of the source gas G in the conventional vapor phase growth apparatus will be explained referring to the drawing for explaining operations shown in FIG. 8. In the conventional vapor phase growth apparatus, the source gas G advances via a preheating ring onto a susceptor, while showing a tendency of deflecting towards the center of the substrate and approaching the horizontal standard line HSL. This is because the source gas G tends to flow in the direction possibly minimizing the resistance, when it passes through the gas introducing gap 60' (hatched portion) formed by a bank component 23' and an upper lining component 4'. Linear path d2 of the source gas G passing through the gas introducing gap 60' is larger than shortest path d1 directed to the center of the substrate. In other words, the resistance exerted on the source gas G advancing towards the susceptor 12 can be minimized, if the gas passes over a top surface 23a' of the bank component 23' along the shortest path d1. Because the bank component 23' and the upper lining component 4' of the conventional vapor phase growth apparatus have ring-like geometries with the same diameter, linear path d2 becomes longer as more distanced from the horizontal standard line HSL. As a consequence, stream of the source gas G flowing more distant from the horizontal standard line HSL, or more closer to the both edge regions in the width-wise direction WL, more largely varies the direction of flow thereof over the top surface 23a' of the bank component 23' towards the center of the substrate.

When the flow velocity of the source gas G is not so large, the gas after climbing over the bank component 23' is once directed towards the center of the substrate, but immediately changes the direction of flow into the downstream direction, due to an elevated pressure in the vicinity of the horizontal standard line HSL where the streams concentrate. Therefore, the event that the source gas G after climbing over the bank component 23' is once directed towards the center of the substrate will be of no critical issue, when the flow velocity of the source gas G is not so large. On the contrary, when the flow velocity of the source gas G is large, streams will not change their directions into the downstream direction up to positions showing the pressure elevated enough in the vicinity of the horizontal standard line HSL, where the streams concentrate. In other words, the travel path towards the center of the substrate grows longer. As a consequence, the event that the source gas G after climbing over the bank component 23' is once directed towards the center of the substrate will result in a larger effect, when the flow velocity of the source gas G is large.

In the epitaxial growth of the silicon single crystal film in the reaction vessel having a pressure conditioned lower than the atmospheric pressure (so-called, reduced-pressure epitaxial growth), the flow velocity of the source gas G flowing through the reaction vessel is several times faster than in the normal-pressure epitaxial growth. Therefore, in particular in the reduced-pressure epitaxial growth, the event that the source gas G after climbing over the bank component 23' is once directed towards the center of the substrate becomes not negligible.

In contrast to this, the vapor phase growth apparatus 1 of this invention is configured so that the length-to-be-formed of the gas introducing gap 60 is reduced as more distanced from the horizontal standard line HSL in the width-wise direction WL. According to this configuration, the phenomenon of a large change in the direction of flow of the source gas G, towards the horizontal standard line HSL, becomes less likely to occur. The source gas G can therefore flow relatively straight towards the susceptor 12. This successfully ensures a uniform flow route over the substrate W.

Experimental Cases
(Computer Simulation Experiments)

A flow route of the source gas in the vapor phase growth apparatus 1 as shown in FIGS. 1 to 4 was found by computer simulation. For the comparative purpose, also a flow route of the source gas in the conventional vapor phase growth apparatus having an unimproved upper lining component was found. Also a growth rate distribution of the silicon single crystal film when it was epitaxially grown on the silicon single crystal substrate in the vapor phase growth apparatus 1 shown in FIGS. 1 to 4 was estimated by computer simulation. For the comparative purpose, also a growth rate distribution of the silicon single crystal film when it was epitaxially grown on the silicon single crystal substrate in the conventional vapor phase growth apparatus was estimated. Set conditions were as listed below.

Software: Fluent Ver 6.0 (product of Fluent Asia Pacific Co., Ltd.)

(Dimensions)
  Inner diameter of bank component=300 mm
  $R_3$ of upper lining component (see FIG. 5)=200 mm
  Height of reaction vessel (distance from the susceptor 12 to the inner top surface of the reaction vessel 2)=20 mm
  Height of bank component (height measured from the lower surface 23c of the cut-off portion 23k to the top surface 23a of the bank component 23)=16 mm
  Diameter of silicon single crystal substrate=200 mm (Growth Temperature)
  Silicon single crystal substrate: 1400 K
  Top surface of reaction vessel: 700 K (Pressure in Reaction Vessel)
  10000 Pa (Source Gas)
  Trichlorosilane: 1.5 mol %
  Hydrogen: 98.5 mol %

(Flow Rate of Source Gas)

Inner Introduction Path: 13.5 L/min (standard state)
Outer Introduction Path: 13.5 L/min (standard state)

Figure 10A:
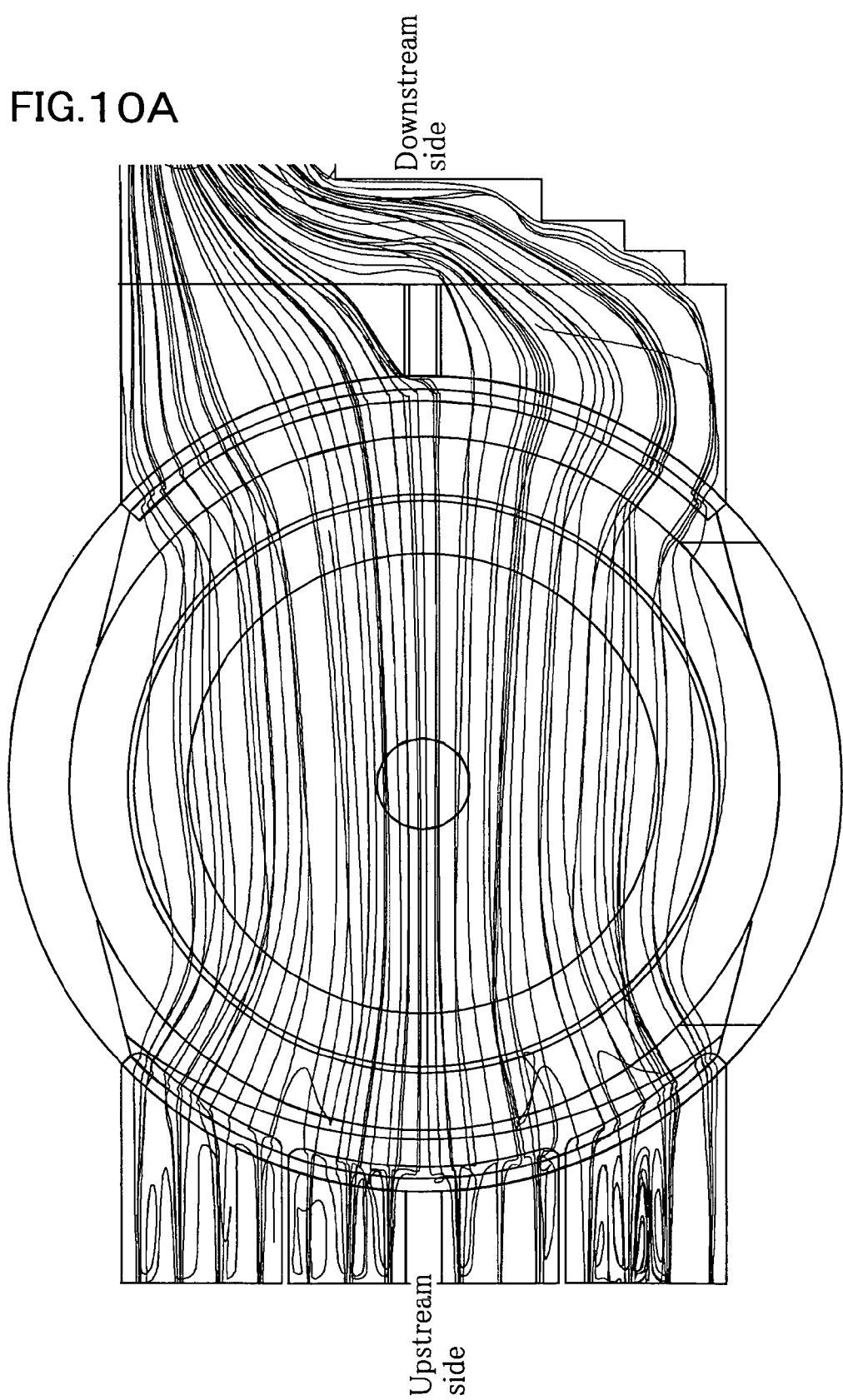
FIG. 10A is a drawing showing a flow route distribution of the source gas in the vapor phase growth apparatus of this invention, obtained by a computer simulation.
Figure 11A:
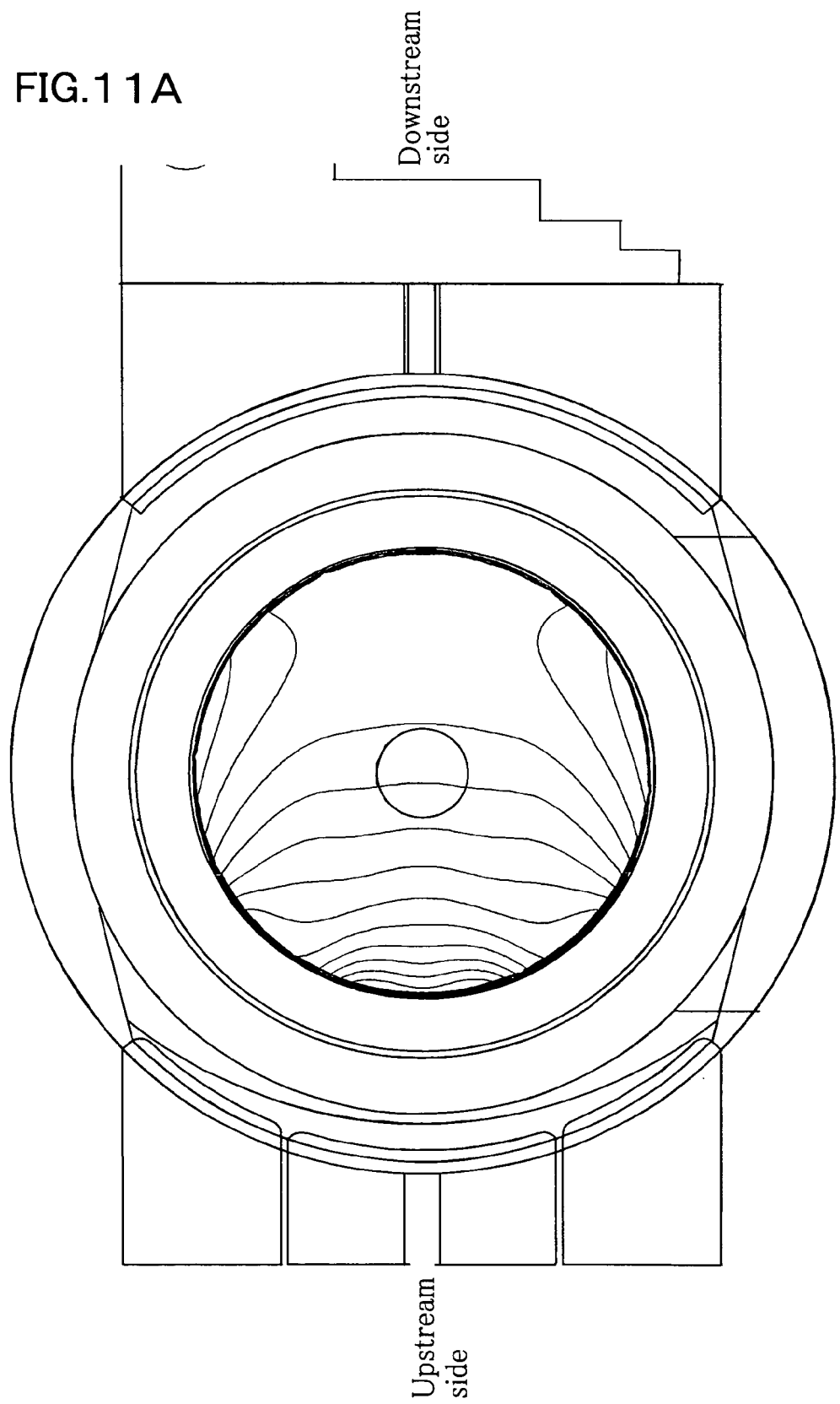
FIG. 11A is a contour map showing a growth rate distribution in the vapor phase growth apparatus of this invention, obtained by a computer simulation.
Figure 11B:
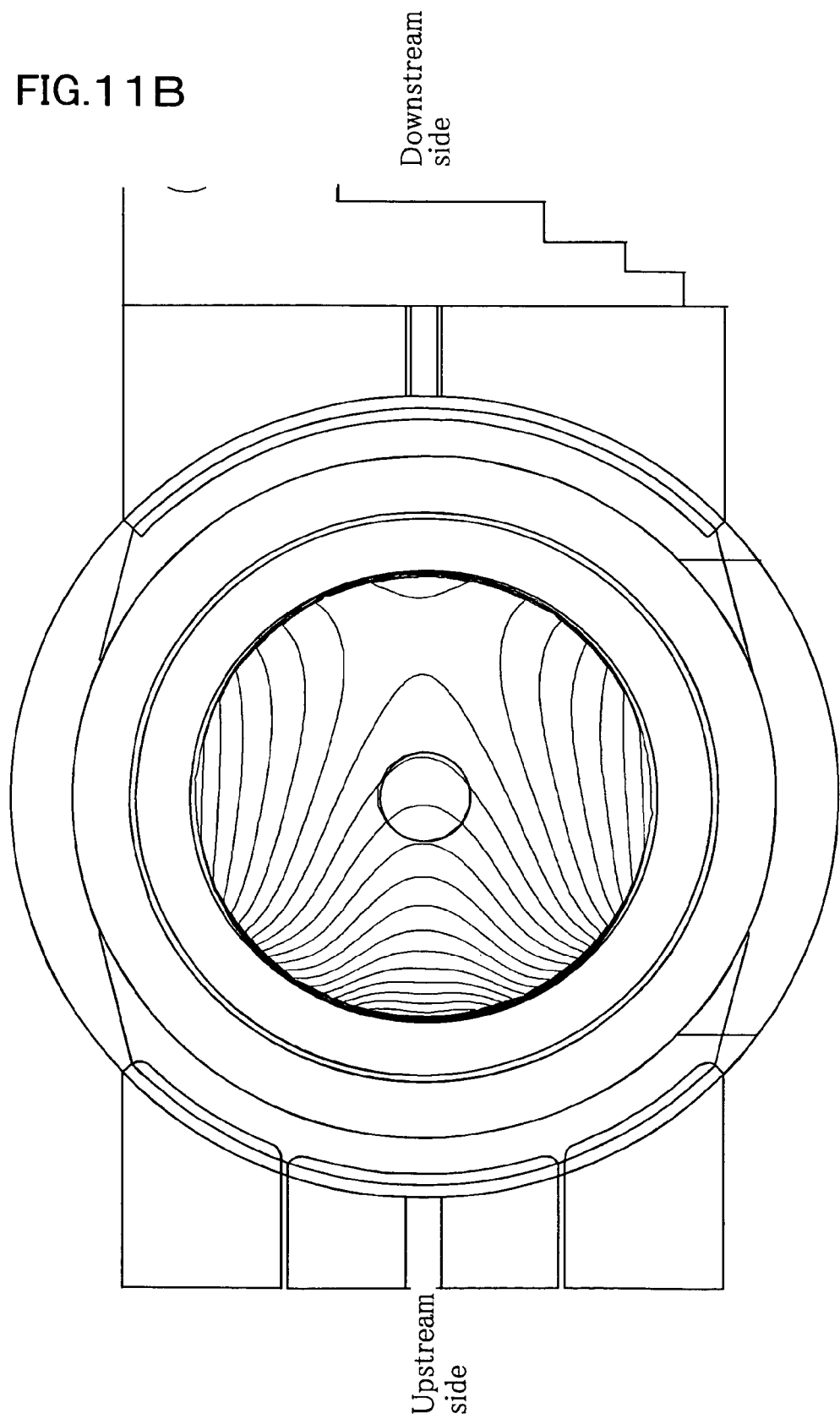
FIG. 11B is a contour map showing a growth rate distribution in the conventional vapor phase growth apparatus, obtained by a computer simulation.

FIGS. 10A and 10B are drawings showing the flow routes of the source gas G obtained by the computer simulation, and FIGS. 11A and 11B are contour maps showing growth rate distributions of the silicon single crystal film. FIGS. 10A and 11A correspond to the cases using the vapor phase growth apparatus 1 of this invention, and FIGS. 10B and 11B correspond to the cases using the conventional vapor phase growth apparatus.

First as seen in FIG. 10A, the source gas in the vapor phase growth apparatus 1 of this invention shows only a small tendency of approaching towards the center of the substrate (horizontal standard line HSL). On the other hand, as shown in FIG. 10B, the source gas G in the conventional vapor phase growth apparatus shows a large inward deflection in the direction of flow over the top surface 23a of the bank component 23.

The contour maps of the growth rate distribution as seen next in FIGS. 11A and 11B show the contours indicating slower growth rates as the flow advances towards the downstream side, because it is assumed herein that the silicon single crystal substrate W is not rotated. The contours in the conventional vapor phase growth apparatus showed a large waving, whereas the contours in the vapor phase growth apparatus 1 of this invention were found to show only a small rippling.

What is claimed is:

1. A vapor phase growth apparatus that allows vapor phase growth of a silicon single crystal film on a main surface of a silicon single crystal substrate, comprising:
   a reaction vessel that comprises:
      a gas introducing port formed on a first end side in a horizontal direction that is parallel to a horizontal standard line through which a source gas for forming the silicon single crystal film is introduced into the reaction vessel; and
      a gas discharging port on a second end side in the horizontal direction through which the source gas is discharged out of the reaction vessel;
   a disc-formed susceptor that is rotatable about an axis in an inner space of the reaction vessel on which the silicon single crystal substrate is disposed in a near-horizontally rotating manner in the inner space of the reaction vessel;
   a bank component that surrounds the susceptor and that is positioned so that a top surface of the bank component aligns with a top surface of the susceptor;
   an upper lining component that overlaps the bank component; and
   a gas introducing gap formed by the bank component and the upper lining component that is configured to communicate with the reaction vessel, the gas introducing gap having a length that is parallel to the horizontal standard line, the length of the gas introducing gap decreasing in a continuous or step-wise manner as a distance from the horizontal standard line increases in a width-wise direction,
   wherein:
   the vapor growth apparatus is configured (1) to allow the source gas to flow along the main surface of the silicon single crystal substrate, and (2) to open the gas introducing port such that the gas introducing port opposes an outer peripheral surface of the bank component so that the source gas supplied through the gas introducing port collides against the outer peripheral surface of the bank component, climbs up onto the top surface of the bank component, and flows along the main surface of the silicon single crystal substrate positioned on the susceptor,
   the horizontal standard line is a virtual center line along a direction of flow of the source gas that extends from the first end side of the reaction vessel to the second end side of the reaction vessel, and is normal to and intersects the axis of rotation of the susceptor,
   the width-wise direction is a direction that is normal to both the axis of rotation of the susceptor and the horizontal standard line,
   the top surface of the bank component has an inner periphery located on a side closest to the axis of rotation of the susceptor,
   the inner periphery of the top surface of the bank component forms an arc that has a center that coincides with the axis of rotation of the susceptor,
   the upper lining component has a lower surface that is parallel to and overlaps the top surface of the bank component,
   the lower surface of the upper lining component has an inner periphery located on a side closest to the axis of rotation of the susceptor,
   the inner periphery of the lower surface of the upper lining component forms an arc that has a center that is on the second end side of the axis of rotation, and
   the radius of the arc formed by the inner periphery of the lower surface of the upper lining component is greater than the radius of the arc formed by the inner periphery of the top surface of the bank component.

2. The vapor phase growth apparatus as claimed in claim 1, wherein:
   the gas introducing gap is formed between the lower surface of the upper lining component and the top surface of the bank component, and
   the lower surface of the upper lining component has a length that is parallel to the horizontal standard line, and
   the length of the lower surface of the upper lining component decreases a distance from the horizontal standard line increases in the width-wise direction.

3. The vapor phase growth apparatus as claimed in claim 1, wherein the inner periphery of the top surface of the bank component is closer to the axis of rotation of the susceptor than the inner periphery of the lower surface of the upper lining component.

4. The vapor phase growth apparatus as claimed in claim 1, further comprising an evacuation system keeping the inner space of the reaction vessel under a reduced pressure that is lower than the atmospheric pressure.

5. A vapor phase growth apparatus that allows vapor phase growth of a silicon single crystal film on a main surface of a silicon single crystal substrate, comprising:
   a reaction vessel that comprises:
      a gas introducing port formed on a first end side in a horizontal direction that is parallel to a horizontal standard line through which a source gas for forming the silicon single crystal film is introduced into the reaction vessel; and
      a gas discharging port on a second end side in the horizontal direction through which the source gas is discharged out of the reaction vessel;
   a disc-formed susceptor that is rotatable about an axis in an inner space of the reaction vessel on which the silicon single crystal substrate is disposed in a near-horizontally rotating manner in the inner space of the reaction vessel;

a bank component that surrounds the susceptor and is positioned so that a top surface of the bank component aligns with a top surface of the susceptor;

an upper lining component that overlaps the bank component; and a gas introducing gap that communicates with the reaction vessel, the reaction vessel being formed by the bank component and the upper lining component, wherein:

the vapor growth apparatus is configured (1) to allow the source gas to flow along the main surface of the silicon single crystal substrate, and (2) to open the gas introducing port such that the gas introducing port opposes an outer peripheral surface of the bank component so that the source gas supplied through the gas introducing port collides against the outer peripheral surface of the bank component, climbs up onto the top surface of the bank component, and flows along the main surface of the silicon single crystal substrate positioned on the susceptor, the top surface of the bank component has an inner periphery located on a side closest to the axis of rotation of the susceptor, the inner periphery of the top surface of the bank component forms an arc that has a center that coincides with the axis of rotation of the susceptor, the upper lining component has a lower surface that is parallel to and overlaps the top surface of the bank component, the lower surface of the upper lining component has an inner periphery located on a side closest to the axis of rotation of the susceptor, the inner periphery of the lower surface of the upper lining component forms an arc that has a center that is on the second end side of the axis of rotation of the susceptor, the radius of the arc formed by the inner periphery of the lower surface of the upper lining component is greater than the radius of the arc formed by the inner periphery of the top surface of the bank component, the inner periphery of the top surface of the bank component is closer to the axis of rotation of the susceptor than the inner periphery of the lower surface of the upper lining component, the gas introducing gap has a length that is parallel to the horizontal standard line and the length of the gas introducing gap gradually decreases as a distance from the horizontal standard line increases, and the horizontal standard line is a virtual center line along a direction of flow of the source gas that extends from the first end side of the reaction vessel to the second end side of the reaction vessel, and is normal to and intersects the axis of rotation of the susceptor.

6. The vapor phase growth apparatus as claimed in claim 5, further comprising an evacuation system keeping the inner space of the reaction vessel under a reduced pressure that is lower than the atmospheric pressure.

\* \* \* \* \*